(12) United States Patent
Tankielun et al.

(10) Patent No.: US 10,284,306 B2
(45) Date of Patent: May 7, 2019

(54) CALIBRATION SYSTEMS AND METHODS

(71) Applicant: Rohde & Schwarz GmbH & Co. KG, München (DE)

(72) Inventors: Adam Tankielun, Ottobrunn (DE); Corbett Rowell, München (DE); Christoph Pointner, München (DE); Hendrik Bartko, Unterhaching (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 169 days.

(21) Appl. No.: 15/384,762

(22) Filed: Dec. 20, 2016

(65) Prior Publication Data
US 2018/0034564 A1 Feb. 1, 2018

Related U.S. Application Data

(60) Provisional application No. 62/368,362, filed on Jul. 29, 2016.

(51) Int. Cl.
*H04B 17/12* (2015.01)
*H04B 17/00* (2015.01)
*H04B 17/10* (2015.01)
*G01R 29/10* (2006.01)
*H01Q 3/26* (2006.01)
*H01Q 21/06* (2006.01)

(52) U.S. Cl.
CPC .......... *H04B 17/12* (2015.01); *G01R 29/10* (2013.01); *H01Q 3/267* (2013.01); *H01Q 21/061* (2013.01); *H04B 17/0085* (2013.01); *H04B 17/102* (2015.01)

(58) Field of Classification Search
CPC .. H04B 17/12; H04B 17/102; H04B 17/0085; H01Q 21/061; H01Q 3/267

USPC ........................................ 455/67.11, 67.14
See application file for complete search history.

(56) References Cited

U.S. PATENT DOCUMENTS

2008/0129613 A1* 6/2008 Ermutlu ................ H01Q 3/267
343/703
2011/0034130 A1 2/2011 Konanur et al.
(Continued)

FOREIGN PATENT DOCUMENTS

EP 0901183 A2 3/1999
WO 2014169934 A1 10/2014

OTHER PUBLICATIONS

Commonly-assigned, co-pending U.S. Appl. No. 15/384,920 for "Calibration Systems and Methods," (Unpublished, filed Dec. 20, 2016).
(Continued)

*Primary Examiner* — Ayodeji O Ayotunde
(74) *Attorney, Agent, or Firm* — Shumaker & Sieffert, P.A.

(57) ABSTRACT

A calibration system for calibrating an antenna array comprising a plurality of antenna elements comprises a signal generator for generating a predetermined test signal and, the signal generator being couplable to the antenna elements for providing the test signal to the antenna elements, a number of probes for measuring at least one physical parameter, which is influenced by emissions of the antenna elements, and providing respective measurement signals, and a position determination unit for determining based on the measurement signals the positions of the antenna elements as calibrated positions.

30 Claims, 12 Drawing Sheets

(56) References Cited

U.S. PATENT DOCUMENTS

| | | | |
|---|---|---|---|
| 2011/0267216 A1 | 11/2011 | Smith | |
| 2014/0300519 A1* | 10/2014 | Estebe | H01Q 3/267 343/703 |
| 2015/0139046 A1 | 5/2015 | Wang et al. | |
| 2016/0043778 A1* | 2/2016 | Sikina | H04B 5/0043 455/41.1 |

OTHER PUBLICATIONS

Commonly-assigned, co-pending U.S. Appl. No. 15/384,955 for "Calibration Systems and Methods," (Unpublished, filed Dec. 20, 2016).

* cited by examiner

CALIBRATION SYSTEMS AND METHODS

PRIORITY CLAIM

The present application claims the benefit of U.S. Provisional Patent Application Ser. No. 62/368,362, filed Jul. 29, 2016, the disclosure of which is incorporated herein by reference in its entirety.

TECHNICAL FIELD

The invention relates to calibration systems and methods for calibrating antenna arrays and RF devices.

BACKGROUND

Although applicable to any system that uses wireless signals, the present invention will be described in combination with testing of wireless communication devices.

Modern wireless communication devices use radio frequency signal to transmit data and or speech. Manufacturers of such communication devices always try to improve the efficiency of the communication devices and at the same time have to fulfil legal or regulatory regulations.

Therefore, extensive testing of such communication devices is performed during development, production and after production. Such testing serves quality assurance and compliance tests.

SUMMARY

There is a need for improved testing of wireless devices.

In a first aspect, the invention provides a calibration system for calibrating an antenna array comprising a plurality of antenna elements, i.e. two or more antenna elements. The system comprises a signal generator for generating a predetermined test signal and, the signal generator being configured to provide the test signal to the antenna elements, a number of probes, i.e. one or more probes, for measuring at least one physical parameter, which is influenced by emissions or receptions of the test signal by the antenna elements, and providing respective measurement signals, and a position determination unit for determining based on the measurement signals the positions of the antenna elements as calibrated positions.

In modern communication systems, like e.g. smartphone or other mobile equipment, especially so called 5G equipment, antenna arrays can be used to provide compact antenna systems. Such antenna arrays can perform beam forming and are therefore advantageous for improving the signal quality or signal strength in mobile data communications.

Small deviations of the positions of the antenna elements by e.g. just 0.2 mm would already comprise a deviation of 20% or more of the wavelength especially at millimeter wave frequencies. Such deviations can therefore strongly influence the quality of the beamforming in such devices.

Especially with increasing frequencies and therefore smaller wavelengths in the range of 1 mm or less, it is therefore important to exactly know the positions of the single antenna elements of such an antenna array.

Since in most applications the mobile device will have a cover or the antenna array will comprise a protective sheet or layer, it is difficult or impossible to determine the positions optically.

The present invention therefore provides a test signal to the antenna array, which drives the antenna elements to emit an electromagnetic signal, which is then measured as the physical variable by the probes. Or the present invention provides a test signal to the probes to emit an electromagnetic signal, which is received by the antenna array, i.e. the antenna elements, and which is then measured as the physical variable. This can e.g. be performed by a transceiver in a device which carries the antenna array or by a dedicated measuring device, which is coupled to the antenna array for the measurement.

Based on the respective measurement signals the position determination unit will determine positions of the single antenna elements. The position determination unit can e.g. determine the relative positions of the antenna elements, i.e. the positions of the antenna elements relative to an origin of a predetermined coordinate system.

The determined positions can then just exemplarily be provided to the device under test, DUT, i.e. the respective smartphone or the like, which can then calibrate its transceiver accordingly. The determined positions can also be used by test equipment e.g. in an end of line verification after production of the respective device. To support such end of line tests, the calibration system can also store a serial number of the single DUTs in order to match a set of positions to the respective DUT.

In one embodiment, the calibration system can further comprise a motion actuator for moving relative to each other the probes and the antenna array, and a recorder for recording the measurement signals together with the respective positions of the probes. Moving the probes and the antenna array relative to each other means that either the probes can be moved, the antenna array can be moved or both can be moved.

By moving the probes and the antenna elements relatively to each other detailed measurements of the physical variable can be performed, which at least for the most part or even completely cover the space in front of the antenna elements.

In one embodiment, the position determination unit can identify the positions of the antenna elements based on maxima of the measurement signals and the positions of the respective maxima. By measuring the physical variable in front of the antenna elements, the probes will acquire higher values for the measurement signals when the respective probe is directly in front of the respective antenna element. The farther away the probe moves from the antenna element, the lower will be the acquired value of the measurement signal. Therefore, using the maxima of the measurement signal to identify the positions of the antenna elements provides a simple method for identifying the positions.

It is understood, that the distance of the points at which the probes measure the physical variable is chosen according to the desired resolution of the position determination. That means that the distance is at maximum as large as the desired resolution, i.e. between 0.01 mm and 1.0 mm, e.g. 0.05 mm or 0.1 mm.

In one embodiment, the position determination unit can identify the positions of the antenna elements based on positions of the shifts, at which 1D or 2D auto-correlations of a magnitude pattern of the measured signals provide maxima.

In one embodiment, the position determination unit can identify the positions of the antenna elements based on a two dimensional Fourier series or Fourier Transform together with a measurement heatmap of the measured signals.

In one embodiment, the motion actuator can move relative to each other the probes and the antenna array such that the probes move in a first plane that is parallel to a second plane, in which the antenna elements lie. The distance between the planes is ideally chosen small enough for differentiating the signals of the single antenna elements in the resulting measurement signal. The relative movement can especially be performed such the probes cover the antenna array sufficiently to measure the physical parameter for every single antenna element. The result can e.g. be a two dimensional matrix, where every matrix element identifies a probe position, while the value of the respective matrix element represents the value of the respective measurement signal. Such a matrix can also be called heat map. This term becomes obvious if the matrix is displayed as a two-dimensional diagram, in which higher values are displayed with increasingly more intense red colors, while lower values can e.g. be displayed with green or blue colors.

In one embodiment, the motion actuator can move relatively to each other the probes and the antenna array such that the probes move in a plurality of third planes that are parallel to the first plane and each distanced apart from the prior plane by a predetermined distance. The motion actuator will therefore move the probes in a three dimensional space, which lies directly over or in front of the antenna elements. The measurements performed with such a movement, will result in a three dimensional matrix or heat map, which comprises cone or funnel shaped structures, corresponding to the positions of the antenna elements.

The motion actuator can e.g. comprise electric motors and respective mechanical guides, fixtures and the like for affixing the probes and or the DUT. The motion actuator can e.g. comprise a portal arrangement as e.g. used in milling machines or 3D printer. An alternate arrangement could e.g. be a delta printer like arrangement. Alternatively, an X-Y-moving plate can be provided. It is understood that these arrangements are mere examples and that any other arrangement can be used.

In one embodiment, the motion actuator can move the probes to estimated start positions, which are estimated to lie in front of respective antenna elements and further moves the probes in a pre-defined zone until a maximum measurement value is identified. This means that the motion actuator can perform a kind of spatially limited search for the maximum at and around the estimated positions of the single antenna elements. The pre-defined zone can e.g. be as large as the antenna elements plus the position tolerances of the antenna elements. It is understood that any other size can be chosen for the pre-defined zone.

In one embodiment, the signal generator can provide the test signal to all antenna elements at the same time. This means that all antenna elements radiate a respective signal at the same time. If more than one probe is used, a quick measurement can be performed, if the probes are e.g. moved line-wise in front of the antenna array and all antenna elements radiate a signal.

In one embodiment, the signal generator can consecutively provide the test signal to the antenna elements one by one, or provide the test signal to pairs of the antenna elements or to at least three of the antenna elements at the same time. During the measurement, only one antenna element will therefore be active at a given time. The respective measurement signals will therefore not be influenced by neighboring antenna elements and the distinction between single antenna elements will be improved.

It is understood, that the signal generator can also drive the single antenna elements in any adequate pattern to mitigate the mutual influence between neighboring antenna elements and at the same time improve the measurement speed by measuring more than one antenna element at a time.

In one embodiment, the signal generator can generate the test signal comprising a radio frequency, RF, signal of a predetermined frequency.

The signal generator in this case can directly drive the single antenna elements. This is especially useful for DUTs, which comprise a test connector to the antenna elements.

In one embodiment, the signal generator can generate the test signal comprising a digital command signal for a transceiver of the antenna array, which commands the transceiver to drive the single antenna elements with a radio frequency, RF, signal of a predetermined frequency. The signal generator in this case can instruct DUTs, which do not comprise a dedicated connector to the antenna elements, to generate the test signal as needed.

In one embodiment, the probes can comprise a measurement element for measuring the value of the physical parameter and/or electromagnetic signals. Further, the probes can comprise a transmitting element for transmitting the predetermined test signal and/or electromagnetic signals. Also a single element, like e.g. an antenna, can be provided as receiving and transmitting element.

In one embodiment, the measurement element can comprise an antenna.

In one embodiment, the antenna can be adapted to the frequency of the test signal. This means that the antenna's frequency range or band is tuned to the test signal.

In one embodiment, the measurement signal can comprise a voltage and/or a current and/or a power and/or a phase of the measured physical parameter.

In one embodiment, the physical parameter can comprise an electric field and/or a magnetic field and/or an electromagnetic field.

It is understood that the above embodiments of the first aspect can mutatis mutandis be implemented in a respective calibration method. It is further understood, that the elements of the calibration system can be implemented in hardware, software, hardware description, e.g. in a CPLD or FPGA, or any combination of the above. Further, the calibration method can also be implemented at least partially in a computer, i.e. as a computer implemented method.

In a second aspect a calibration system for calibrating a radio frequency, RF, device comprising a plurality of signal paths, each signal path comprising at least an amplifier and an antenna element, is provided. The system comprises a measurement system for driving the signal paths with a predetermined test signal and measuring an output of the signal paths in response to the test signal, a determination module for determining a first signal path, of which the antenna element provides the lowest output of all antenna elements, and a correction factor calculator for calculating based on output of the first signal path a correction factor for the further signal paths such that with the applied correction factor the output of all signal paths is equal within a predetermined acceptance interval.

Just exemplarily the measurement system can be a or part of a calibration system according to claim 1 or any one of its dependent claims. However, the measurement system can be any system that is capable of driving the signal paths and measuring the outputs accordingly. Usually it will be necessary for the measurement system to know the exact positions of the antenna elements. The positions of the single antenna elements can e.g. be determined with a calibration system according to claim 1 or any one of its dependent claims. However, the positions of the single antenna elements can also be provided by any other means.

With the predetermined test signal, all the signal paths should provide the same output, i.e. a signal with the same output power. However, due to tolerances in the single elements of the signal paths, the single signal paths will provide different outputs. Especially when the antenna array is used for beamforming, such deviations in the output power of the single signal paths can deteriorate the quality of the beam-formed signal.

The calibration system mitigates these negative effects by providing a calibration of the single signal paths, such that with the same nominal input signal all signal paths provide the same output. As a basis for the calibration, the signal path with the lowest output is used and the correction factors are calculated in relation to this lowest output.

When these correction factors are applied to the signal paths, with the same nominal input signal the output will be equal within an acceptable range or acceptance interval.

In one embodiment, the measurement system can measure a physical parameter, which is influenced by emissions of the antenna elements in response to the test signal, in front of the antenna elements as the output and provides respective measurement values. The measurement data can e.g. be provided in the form of a two-dimensional or three-dimensional matrix, where every matrix element identifies a position in front of the antenna array, while the value of the respective matrix element represents the measured value of the physical parameter measured at the respective position.

In one embodiment, the determination module can comprise an identification unit, for identifying the values of the measurement data, which represent measurements in front of the positions of the antenna elements. That means the values of the measurement data, which represent the single signal paths.

The determination module can e.g. analyze the output for the single signal paths and determine the respective maximum values.

In one embodiment, the determination module can comprise a comparator, which is configured to compare the values of the measurement data, to determine the first signal path.

In one embodiment, the correction factor calculator can comprise a divider for dividing the lowest output value, which represents the first signal path, by the output value, which represents a respective other one of the signal paths, for calculating the correction factor for said other signal path.

In one embodiment, the calibration system can further comprise a verification unit for verifying that all signal paths provide an output, which is larger than a predetermined minimum output. With the predetermined test signal, every signal path should provide—within certain tolerances—a similar output. Is a single signal paths provides a significantly lower output, that signal path may be defective. The verification unit therefore serves to verify correct functionality of the signal paths and to identify faulty RF devices. The required minimum output can e.g. be set by a user.

In one embodiment, the test signal can drive the signal paths to a predetermined nominal power level. The nominal power level regarding the present patent application is a power level, which is set by the DUT as commanded for all signal paths. That means that in terms of the DUT the output of all signal paths should be the same. However, as already explained above, tolerances can lead to different outputs of the different signal paths. If all the signal paths are driven to the same nominal power level, it is easy to identify deviations of the single signal paths.

In one embodiment, the test signal can set the amplifiers of the signal paths all to the same nominal gain value.

In one embodiment, the test signal can drive the signal paths to a predetermined maximum power level.

If the signal paths are driven to their respective maximum power level, the weakest signal path can easily be identified.

In one embodiment, the test signal can comprise a radio frequency, RF, signal of a predetermined frequency. This is especially useful for RF devices, which comprise a test connector to the antenna elements.

In one embodiment, the test signal can comprise a digital command signal for a transceiver of the RF device, which commands the transceiver to drive the single signal paths with a radio frequency, RF, signal of a predetermined frequency and/or to set the amplifiers of the single signal paths to a predetermined nominal gain factors. The signal generator in this case can instruct RF devices, which do not comprise a dedicated connector to the antenna elements, to generate the test signal as needed.

In one embodiment, the correction factors can be provided as gain factors for the amplifiers of the respective signal paths. This type of correction factors can be used to directly set the gain in the single signal paths without any further signal processing.

In one embodiment, the correction factors can be provided as digital values to a signal-processing unit of the RF device, which drives the signal paths. If the correction factors are provided as digital values to the signal-processing unit, the signal-processing unit can decide how to use the correction factors. The signal-processing unit can set the gain factors of the single amplifiers in the signal paths. However, as an alternative, the signal-processing unit can also modify, i.e. amplify or attenuate, the signals, which are provided to the single signal paths. This allows using fixed gain amplifiers and at the same time, providing calibrated output signals.

In one embodiment, the measurement system can transmit the test signal to the antenna elements and receives from the RF device the measured output of the signal paths. When the measurement system drives the signal paths from within the RF device, the calibration system can calibrate the transmitting signal paths of the RF device. However, it the measurement system sends the test signal to the antenna elements wirelessly via e.g. probe antennas, the RF device can internally measure the output of the receiving signal paths and provide the calibration system with the respective output.

It is understood that the above embodiments of the second aspect can mutatis mutandis be implemented in a respective calibration method. It is further understood, that the elements of the calibration system can be implemented in hardware, software, hardware description, e.g. in a CPLD or FPGA, or any combination of the above. Further, the calibration method can also be implemented at least partially in a computer, i.e. as a computer implemented method.

In a third aspect, the present invention provides a calibration system for calibrating a radio frequency, RF, device comprising a plurality of signal paths, each signal path comprising at least an amplifier and an antenna element. The system comprises a signal generator for driving the signal paths with a predetermined test signal, at least two probes for measuring the output of the signal paths in reaction to the test signal, and a correction factor calculator for calculating respective correction factors based on differences in at least one characteristic of the measured outputs of the signal paths.

In modern communication systems, like e.g. smartphone or other mobile equipment, especially so called 5G equipment, antenna arrays can be used to provide compact antenna systems. Such antenna arrays can perform beam forming and are therefore advantageous for improving the signal quality or signal strength in mobile data communications.

However, the single signal paths in such devices will each comprise tolerances, which will slightly modify the signals while being propagated to the antenna elements. If the signals are then transmitted by the antenna elements e.g. with a phase or a frequency that deviates from the intended signal, the transmitting capabilities and especially the beamforming capabilities may deteriorate.

With the predetermined test signal being provided to all signal paths, all the signal paths should provide the same output, i.e. a signal with the same phase, the same amplitude, the same frequency and the same timing. However, as already indicated the single elements of the signal paths, in transmitting direction as well as in receiving direction, will comprise tolerances. These tolerances are introduced into the elements during production due to inevitable inaccuracies and size variations. Even though these tolerances may be minute, they will still influence the signal propagation in the respective signal path. Therefore, the single signal paths will provide different outputs, when provided with the same input signal, i.e. the test signal.

Especially, when the antenna array is used for beamforming, such deviations in the output power and phase of the single signal paths can deteriorate the quality of the beamformed signal. The calibration system mitigates these negative effects by providing a calibration of the single signal paths. Calibration in this context refers to a modification or configuration of elements of the signal paths or the signal generation, such that the differences caused by the tolerances in the signal paths are balanced.

The use of at least two probes, i.e. antennas, allows analyzing the single measured outputs and especially the differences between the measured outputs in real time and in more depth than if the outputs where analyzed separately.

In one embodiment, the characteristics of the measured outputs can comprise a phase and/or an amplitude and/or a frequency and/or a timing of the outputs.

In one embodiment, the correction factor calculator can calculate the correction factor based on a difference in phase of the measured outputs.

In one embodiment, the correction factor calculator can calculate the correction factor based on a difference in amplitude of the measured outputs.

In one embodiment, the correction factor calculator can calculate the correction factor based on a difference in frequency and/or timing of the measured outputs.

In one embodiment, the correction factor calculator can provide the correction factors directly to elements of the respective signal paths. This type of correction factors can be used to directly set e.g. the gain, a phase shift and/or a frequency in the single signal paths without any further signal processing. The signal paths can e.g. comprise configurable phase shifters or the like, which can be configured. It is understood, that directly configured refers to setting parameters of elements of the signal chain as opposed to perform signal-processing calculations. This means that the correction factors can also be provided to any kind of processing unit in the RF device, which configures the correction factors in the respective elements.

In one embodiment, the correction factor calculator can provide the correction factors as digital values to a signal-processing unit of the RF device, which drives the signal paths. The signal-processing unit opposed to the above can modify, i.e. amplify or attenuate, the signals, which are provided to the single signal paths via signal processing calculations. This allows using fixed gain amplifiers or other fixed elements in the signal paths and at the same time providing calibrated output signals.

In one embodiment, the signal generator can generate the test signal comprising a radio frequency, RF, signal. The RF signal can have a predetermined frequency or timing, a predetermined phase and/or a predetermined amplitude. This kind of test signal is especially useful for RF devices, which comprise a test connector to the antenna elements.

In one embodiment, the signal generator can provide the RF signal to internal connectors of the RF device for driving the signal paths with the RF signal. The signal generator in this case can instruct RF devices, which do not comprise a dedicated connector to the antenna elements, to generate the test signal as needed.

In one embodiment, the signal generator can provide the RF signal to the probes for transmitting the test signal to the respective antenna elements of the respective signal paths. If the test signal is transmitted wirelessly to the antenna elements by the probes, the receiving signal path of the respective antenna element can be analyzed. The output can e.g. be provided to the calibration system by the RF device via digital interface.

In one embodiment, the signal generator can provide a first sub-signal of the RF signal to the probes for transmitting the test signal to the respective antenna elements of the respective signal paths, and wherein the signal generator provides a second sub-signal of the RF signal to the RF device for driving the signal paths with the RF signal. The first and the second sub-signals e.g. both comprise different frequencies. As an alternative, the first and the second sub-signals can be interleaved in a timely fashion. This allows testing the sending and the receiving parts of the signal paths at the same time.

In one embodiment, the signal generator can generate the test signal comprising a digital command signal for a transceiver of the RF device, which commands the transceiver to drive the single signal paths with a radio frequency, RF, signal of a predetermined frequency. The signal generator in this case can instruct RF devices, which do not comprise a dedicated connector to the antenna elements, to generate the test signal as needed.

In one embodiment, the probes can be spaced apart from each other by a predetermined distance, which defines an exclusion zone. The distance between the probes makes sure that no mutual influences falsify the measurements.

In one embodiment, the predetermined distance can define a distance between the apertures of two probes.

In one embodiment, the predetermined distance can be at least 0.4 times the wavelength of the test signal, especially of the test signal in the material that comprises more than 50% of the space between the probes.

It is understood that the above embodiments of the third aspect can mutatis mutandis be implemented in a respective calibration method. It is further understood, that the elements of the calibration system can be implemented in hardware, software, hardware description, e.g. in a CPLD or FPGA, or any combination of the above. Further, the calibration method can also be implemented at least partially in a computer, i.e. as a computer implemented method.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments, which are specified in the schematic figures of the drawings, in which.

DETAILED DESCRIPTION OF THE DRAWINGS

Figure 1:
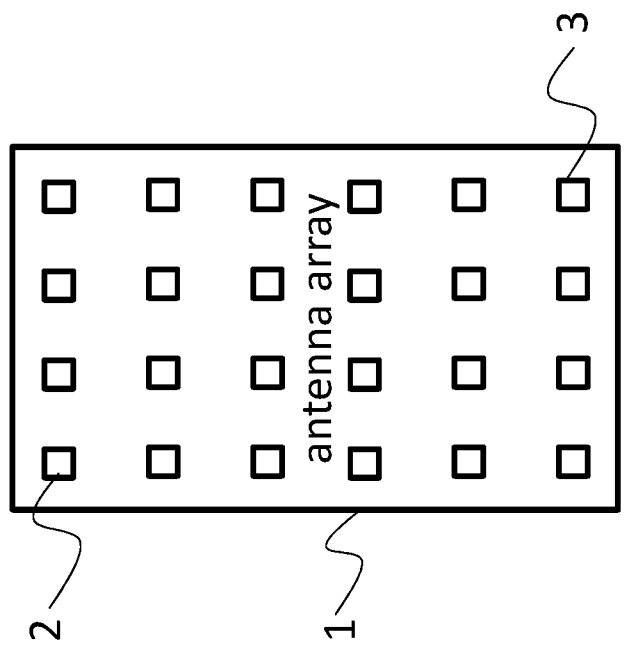
FIG. 1 shows a diagram of an embodiment of an antenna array.

FIG. 1 shows a block diagram of an embodiment of an antenna array 1, which comprises a number of antenna elements 2, 3. For sake of clarity only the first and the last antenna elements 2, 3 have been provided with a reference sign.

The antenna array 1 comprises four columns and six lines of antenna elements 2, 3, i.e. a total of 24 antenna elements. The single antenna elements 2, 3 are equidistant to each other column-wise and row-wise. This antenna array 1 is just an exemplary antenna element. Other antenna elements can have any number of antenna elements spaced apparat at any distances.

Figure 2:
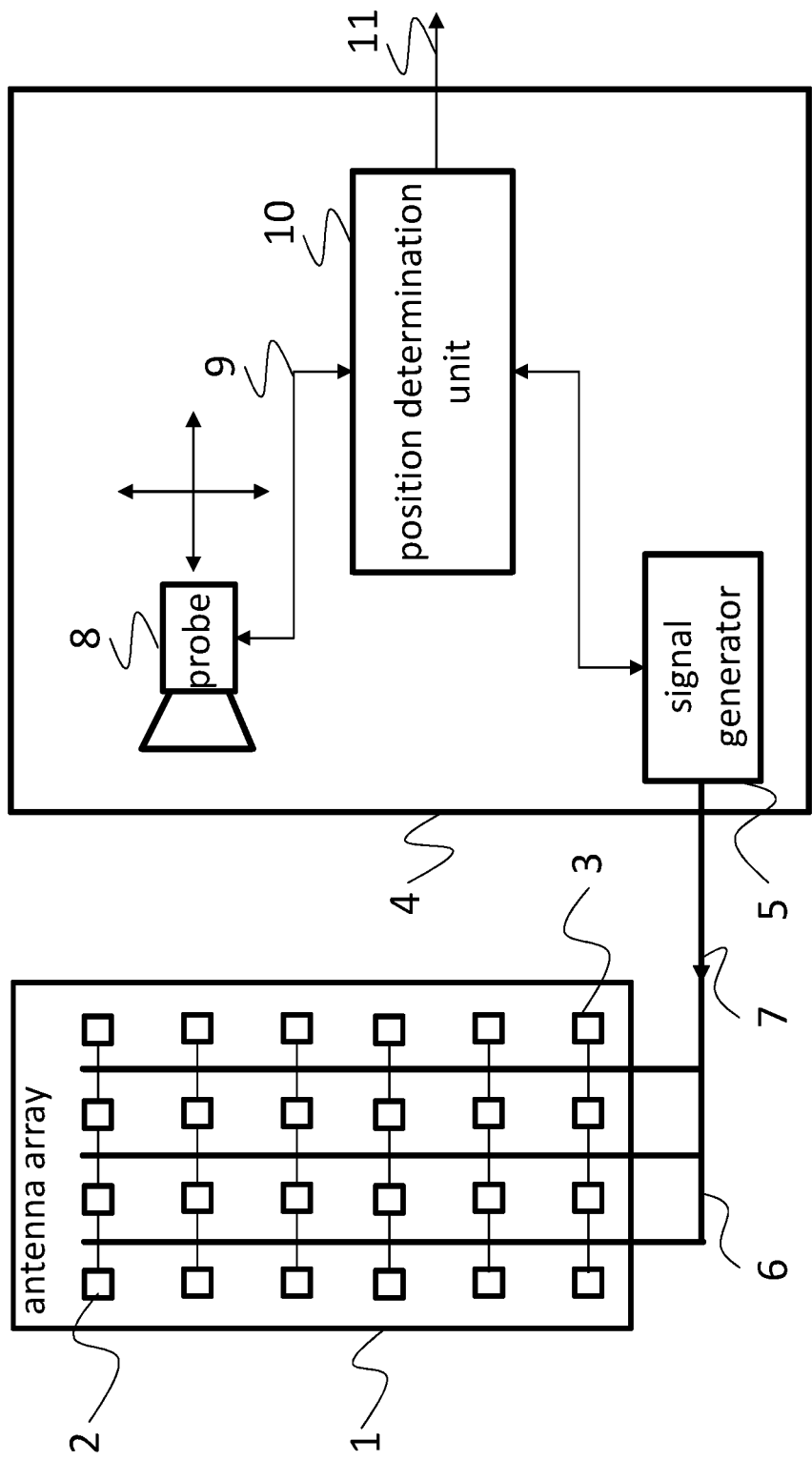
FIG. 2 shows a block diagram of an embodiment of a calibration system according to the present invention.

FIG. 2 shows a block diagram of an embodiment of a calibration system 4 according to the first aspect of the present invention. The calibration system 4 comprises a signal generator 5, which is coupled to the single antenna elements 2, 3 via signal lines, which are shown in FIG. 2 as a signal bus 6. The signal bus 6 carries the test signal 7, which the signal generator 5 generates to the single antenna elements 2, 3. In FIG. 2, the signal generator 5 is connected to the antenna elements 2, 3 via a single signal bus 6. However, this bus is just exemplarily drawn as a single line. In fact, the signal bus 6 can comprise any number of data lines. The signal bus 6 can especially comprise a dedicated signal line to each one of the antenna elements 2, 3. This allows the signal generator 5 to drive specific single antenna elements 2, 3 or specific groups of antenna elements 2, 3. In another embodiment, the signal generator 5 can be indirectly coupled to the antenna elements 2, 3 via a signal-processing device of the antenna array 1 or the device, which carries the antenna array 2, e.g. a smartphone.

The signal generator 5 may comprise any means, which are capable of generating the respective signal. Such means may e.g. comprise an oscillator coupled to further signal generation devices, like e.g. e PLL or the like. If the signal generator 5 is coupled to a signal processing device as explained above, the signal generator 5 can comprise means for generating a digital data signal, which comprises information about the test signal 7 such that the signal processing device can generate the test signal 7 for the respective antenna elements 2, 3.

The calibration system 4 further comprises a probe 8, which can be moved at least in two axis, i.e. a plane. This plane can especially be parallel to the plane of the antenna array 1. The distance between the planes must be small enough for the signals of the single antenna elements 2, 3 to be distinguishable. If the probe moves to far away from the antenna elements 2, 3 the signals of different antenna elements 2, 3 will blend into each other and no exact measurement will be possible. It is understood that any number of probes 8 can be used, which can be positioned either statically to each other or be movable relative to each other, i.e. they can be moved separately. It is obvious that increasing the number of probes 8 will also increase the measurement speed.

The probe 8 can comprise in one embodiment an antenna (not explicitly shown, see FIG. 3) that is tuned to the frequency of the test signal, e.g. 28 GHz. The probe 8 can provide the measurement signal 9 comprising a voltage, a current and/or a power.

The probe 8 and the signal generator 5 are both coupled in bidirectional communication to the position determination unit 10, which in the embodiment of FIG. 2 further incorporates a central control unit of the calibration system 4. That means that the position determination unit 10 can control the signal generator 5 and the probe 8. For example, the position determination unit 10 start the signal generator 5 or move the probe 8 to a specific position.

The probe 8 will deliver the measurement signals 9 to the position determination unit 10. The position determination unit 10 will analyze this measurement signals to determine the exact positions of the antenna elements 2, 3 and output said positions as calibrated positions 11.

Figure 3:
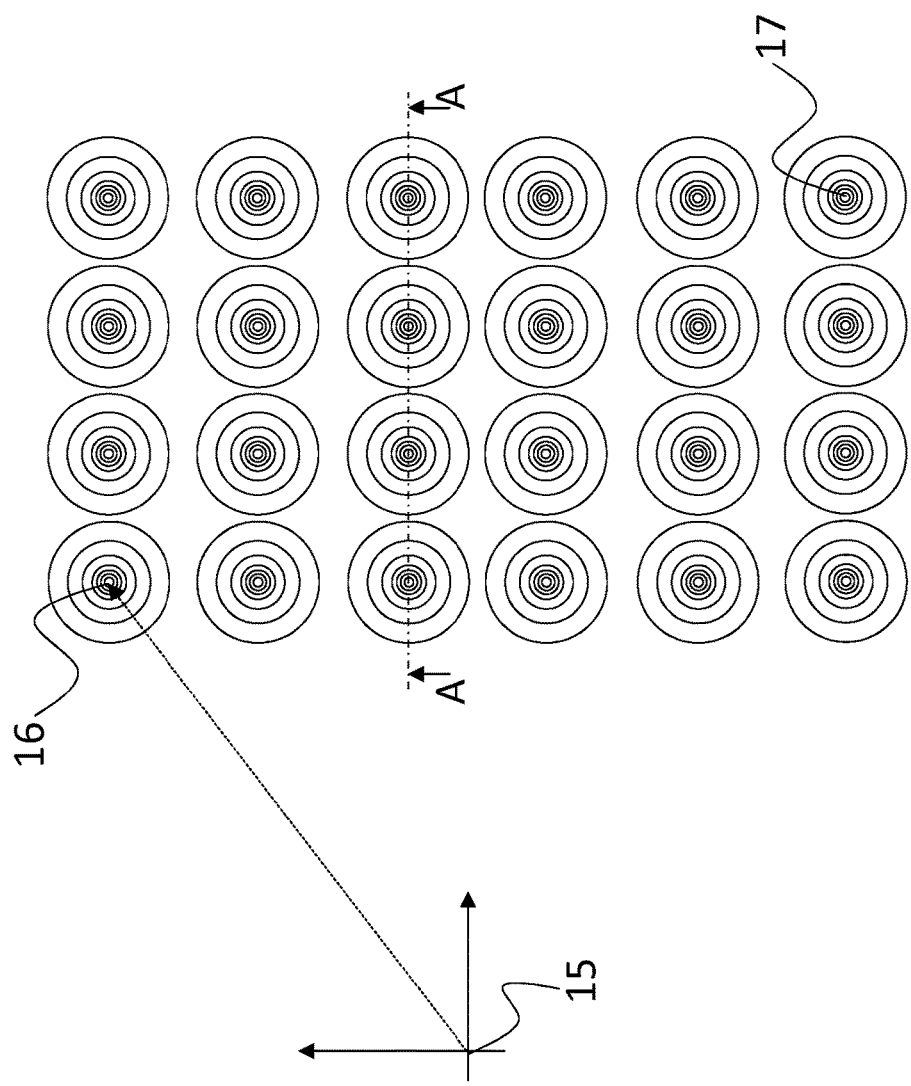
FIG. 3 shows a diagram of an embodiment of measurement signals according to an embodiment of the present invention.

The calibrated positions can e.g. be provided relative to the origin 15 of a predefined coordinate system (see FIG. 3). The coordinate system can also be known to the device, which carries the antenna array 1. This allows the device to use the calibrated positions 11 to internally calibrate or adjust the stored positions for the single antenna elements 2, 3.

FIG. 3 shows a diagram of an embodiment of measurement signals 9, which are shown as two-dimensional map. The two dimensional map is a kind of contour graph, where the intensity of the measurement signal is represented by the distance of the single contour lines. That means that the measured intensity is higher if the distance of the contour lines is smaller. The diagram comprises a local maximum 16, 17 for each one of the antenna elements 2, 3, since at these positions the maximum power can be measured by the probe 8.

As can be seen, in the diagram the origin 15 of a coordinate system is shown. The measurement values 9 of the probe 8 can all be referenced to the position of the probe 8 relative to the origin 15. This allows easily determining the positions of the maxima 16, 17 in the two-dimensional map relative to the origin 15, i.e. in the respective coordinate system.

Figure 4:
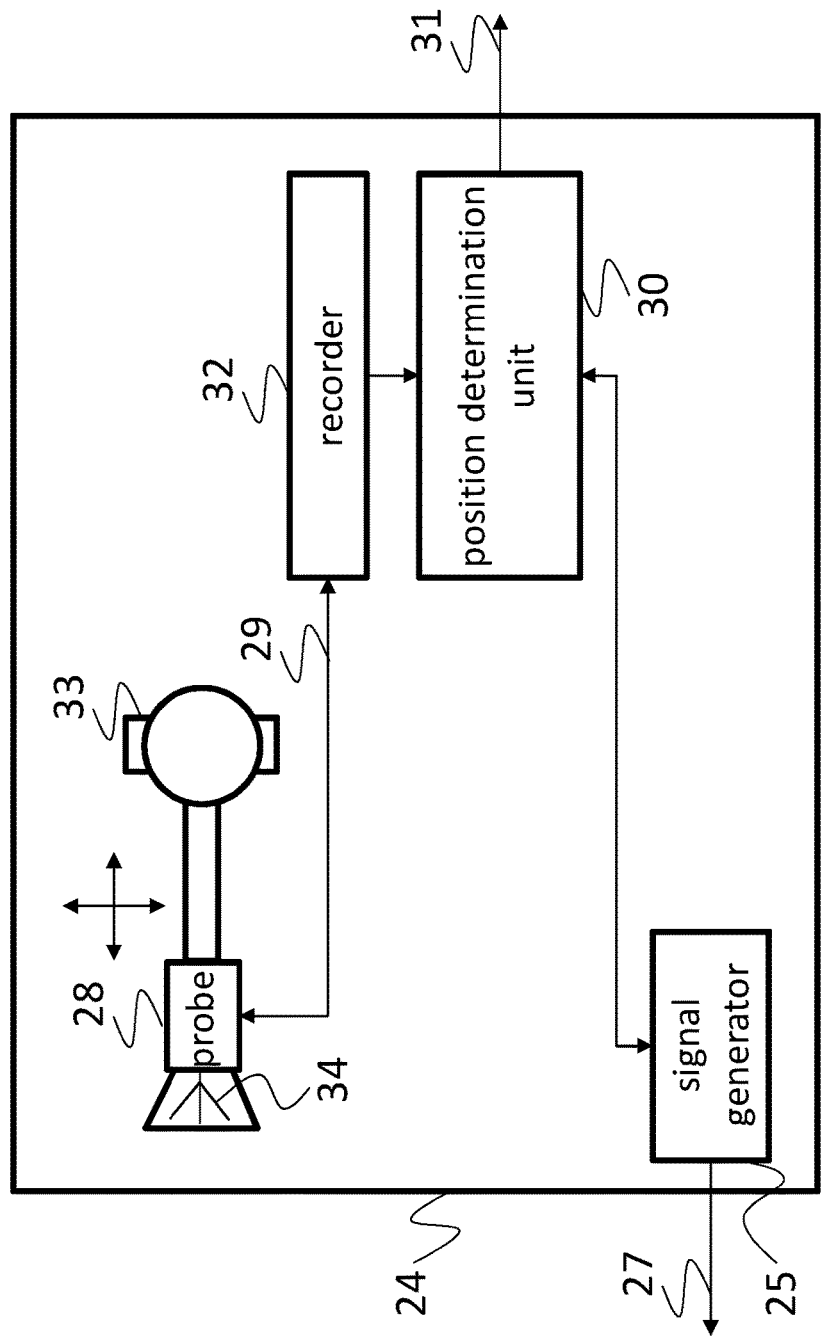
FIG. 4 shows a block diagram of another embodiment of a calibration system according to the present invention.

FIG. 4 shows a block diagram of another embodiment of a calibration system 24, which is based on the calibration system 4 of FIG. 2. Similar elements are provided with similar reference signs as in FIG. 2 but increased by 20.

The calibration system 24 further comprises a recorder 32, which can comprise signal converters, like e.g. analog-to-digital converters, and a memory that stores the measurement values 29 and the respective positions for later processing by the position determination unit 30.

The calibration system 24 also comprises a motion actuator 33 for moving the probe 28. Although not explicitly shown, the motion actuator 33 can e.g. be controller by the position determination unit 30. Finally, the probe 8 comprises an antenna 34 as measurement element.

Figure 5:
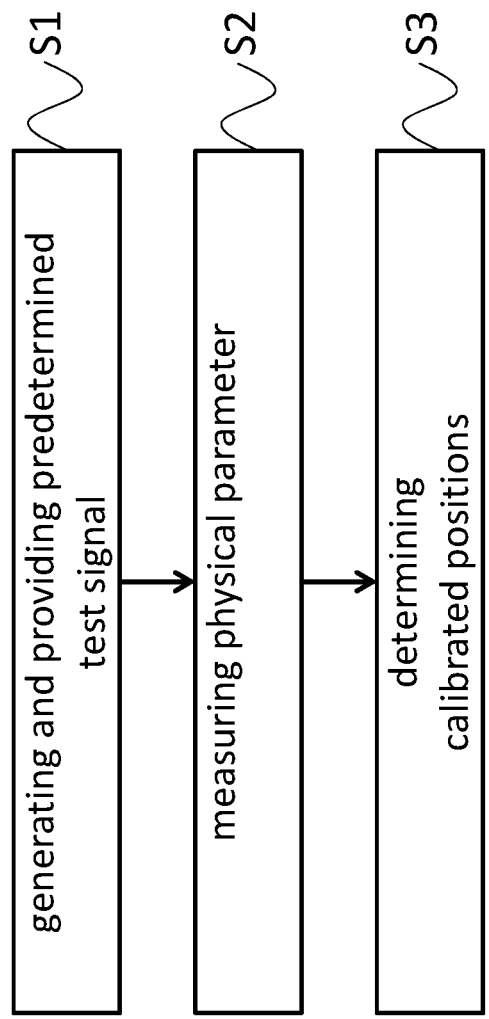
FIG. 5 shows flow diagram of an embodiment of a method according to the present invention.

FIG. 5 shows flow diagram of an embodiment of a method for calibrating an antenna array 1 comprising a plurality of antenna elements.

The method comprises generating, S1, a predetermined test signal 7, 27 and providing the test signal 7, 27 to the antenna elements 2, 3. The test signal 7, 27 can e.g. be provided to all antenna elements 2, 3 at the same time. As an alternative the test signal 7, 27 can be provided consecutively to the antenna elements 2, 3 one by one or group by group. The test signal 7, 27 can comprising a radio frequency, RF, signal of a predetermined frequency, which can be directly fed into the antenna elements 2, 3.

Alternatively, the test signal 2, 27 can comprise a digital command signal for a transceiver of the antenna array 1, which commands the transceiver to drive the single antenna elements 2, 3 with a radio frequency, RF, signal of a predetermined frequency.

Further, at least one physical parameter is measured, S2, with a number of probes 8, 28, which is influenced by emissions of the antenna elements 2, 3. Respective measurement signals 9, 29 are then analyzed to determine, S3, the positions of the antenna elements 2, 3 as calibrated positions 11, 31. When determining the positions of the antenna elements 2, 3, these can be determined based on maxima of the measurement signals 9, 29 and the positions of the respective maxima.

The method can therefore further comprise moving relatively to each other the probes 8, 28 and the antenna array 1, and recording the measurement signals 9, 29 together with the respective positions of the probes 8, 28. The probes 8, 28 can e.g. be moved in a first plane that is parallel to a second plane, in which the antenna elements 2, 3 lie. That means that the probes 8, 28 are moved in front of the antenna array 1 and perform a kind of scan of the surface of the antenna array 1.

The probes 8, 28 can also be moved in a plurality of third planes that are parallel to the first plane and each distanced apart from the prior plane by a predetermined distance. This means that a three-dimensional scan is performed in various planes or layers.

Instead of or as addition to recording the measurement values 9, 29, the probes 8, 28 can be moved to estimated start positions, which are estimated to lie in front of respective antenna elements 2, 3 prior to starting the analysis. The probes 8, 28 can then be moved in a pre-defined zone until a maximum measurement value 9, 29 is identified.

The probes 8, 28 can e.g. comprise a measurement element 34, like e.g. an antenna, for measuring the value of the physical parameter. Such an antenna 34 can be adapted to the frequency of the test signal 7, 27.

Figure 6:
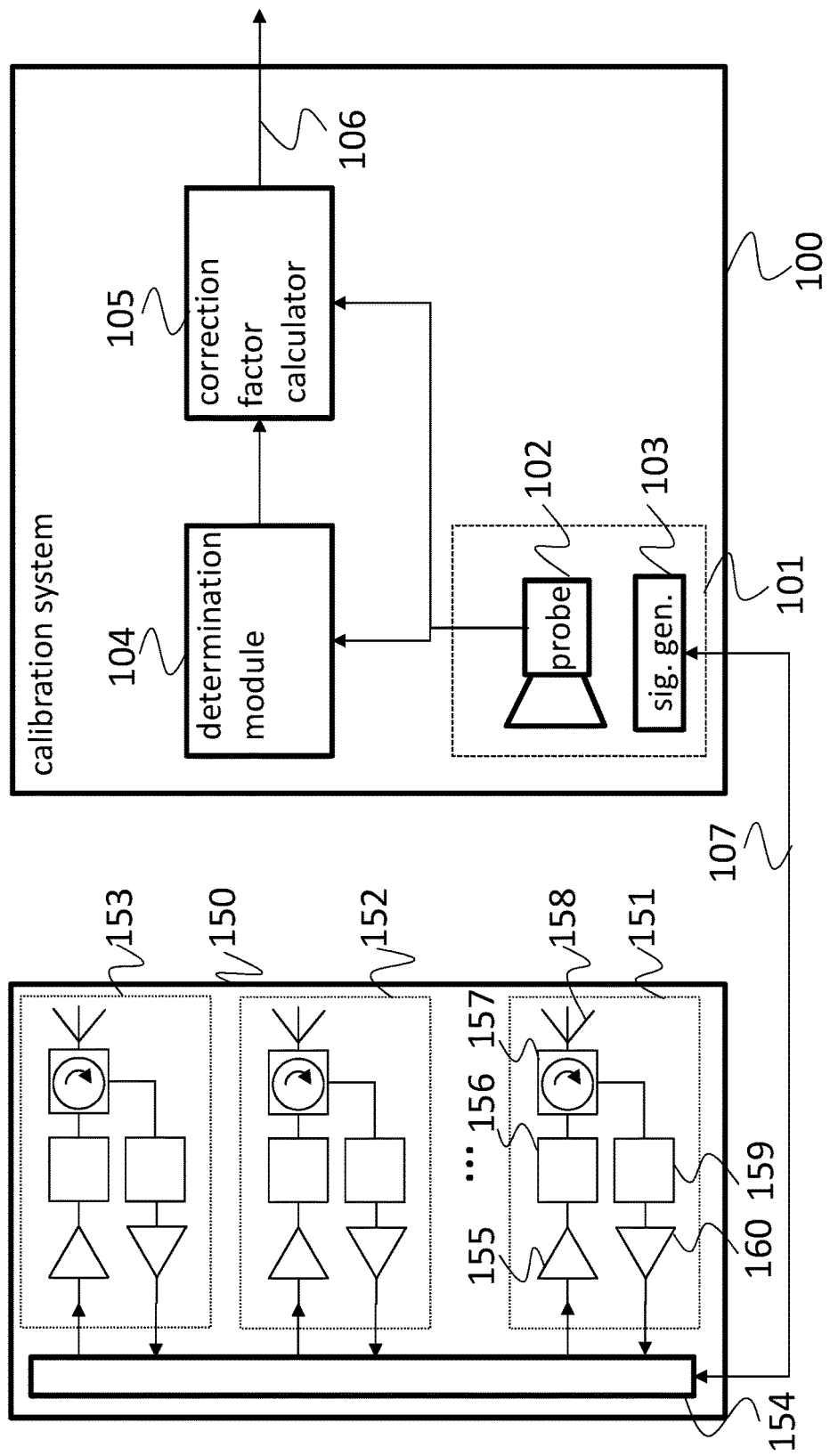
FIG. 6 shows a block diagram of another embodiment of a calibration system according to the present invention.

FIG. 6 shows a block diagram of an embodiment of a calibration system 100 for a RF device 150.

The RF device comprises three of signal paths 151, 152, 153, wherein this number is just exemplary and more or less signal paths are possible (hinted at by three dots). Every signal path 151, 152, 153 in this example comprises a transmit signal chain consisting of an amplifier 155, an optional phase shifter 156, and an antenna element 158. The same antenna element 158 also serves the receive signal chain, which comprises the antenna element 158, an optional phase shifter or filter 159, and an amplifier 160. The signals of the transmit and the receive signal chains are separated by a circulator 157. For sake of simplicity, only the elements of the first signal path 151 are provided with reference signs. The signal paths 151, 152, 153 are connected to a transceiver 154 of the RF device 150, which drives the transmit signal chains and receives signals from the receive signal chains. It is understood, that this arrangement of the RF device 150 is just exemplary and serves to explain the present invention. However, the present invention can be used with any other RF device.

The calibration system 100 comprises a measurement system 101, which serves to measure the signals emitted by the antenna elements 158 or to transmit test signals 107 to the antenna elements 158. If the signals emitted by the antenna elements 158 are measured, e.g. a probe 102 of the measurement system 101 can detect the signals, while a signal generator 103 generated a test signal 107 and transmits this to the transceiver 154 for driving the signal paths 151, 152, 153.

In this case, the test signal 107 can comprise a digital command signal for the transceiver 154 of the RF device 150, which commands the transceiver 154 to drive the single signal paths 151, 152, 153 with a radio frequency, RF, signal of a predetermined frequency and/or to set the amplifiers of the single signal paths 151, 152, 153 to a predetermined nominal, e.g. the maximum, gain factors.

The probe 102 can however also be used to transmit signals to the antenna elements 158. In such a mode, the feedback is provided from the transceiver 154 to the measurement system 101. The test signal in this case can e.g. be a RF signal.

The measurement system 101 can provide a heat map or two-dimensional diagram as shown in FIG. 3. Therefore, one possible measurement system 101 is the measurement system of FIGS. 2 and 4. Based on the output of the measurement system 101, the determination module 104 will determine the antenna element 158, which provides the lowest output. The magnitude of this output will then serve the correction factor calculator 105 to calculate correction factors 106 for the other signal paths 151, 152, 153. When applied to the signal paths 151, 152, 153 the correction factors 106 will equate the outputs of the signal paths 151, 152, 153, at least regarding output signal strength.

Figure 7:
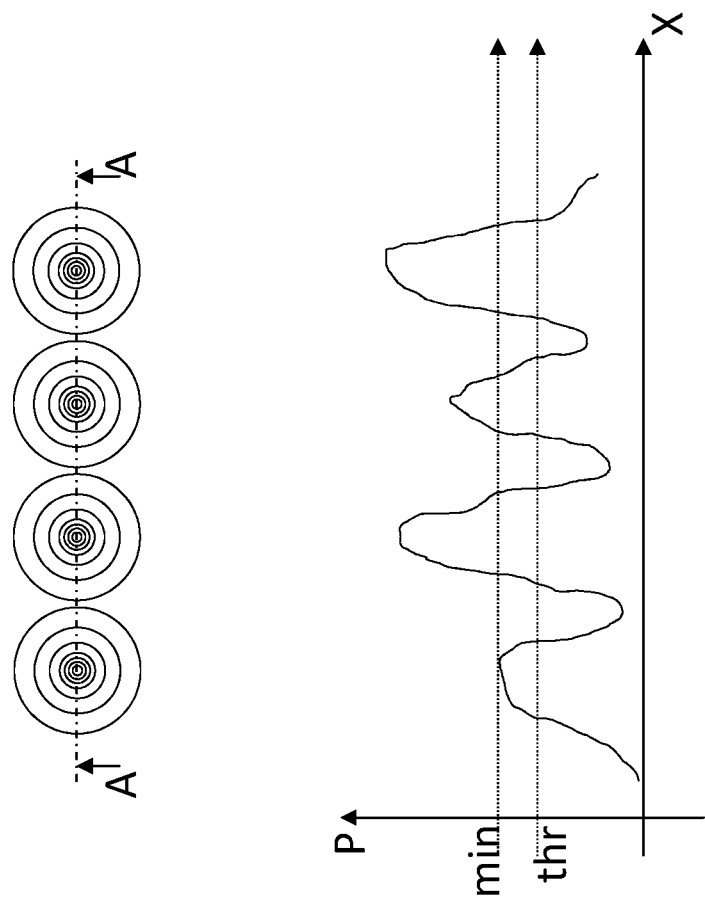
FIG. 7 shows a diagram of an embodiment of measurement signals according to an embodiment of the present invention.

FIG. 7 shows a diagram of the output of the measurement system 101. The lower part of the diagram is a cut through the diagram of FIG. 3 at the cut line A. It can be seen, that for every circle in the diagram of FIG. 3, i.e. every antenna element, there is a local maximum in the diagram of FIG. 7. The abscissa of diagram shows the location in X direction, the ordinate of the diagram shows the power (or any value that refers to the power of the respective signal, e.g. a voltage, a current or the like.

Further, there are two lines drawn in the diagram, a threshold line thr and a minimum line min. The threshold line thr defines a minimum value, which all antenna elements or signal paths 151, 152, 153 have to surpass. If any one of the signal paths 151, 152, 153 does not surpass this threshold thr, the RF device is marked as defective.

The minimum line min refers to the power level of the signal path 151, 152, 153 that provides the lowest power level. That means that this minimum power level min is the basis for later calculating the correction factors 106, 126.

Figure 8:
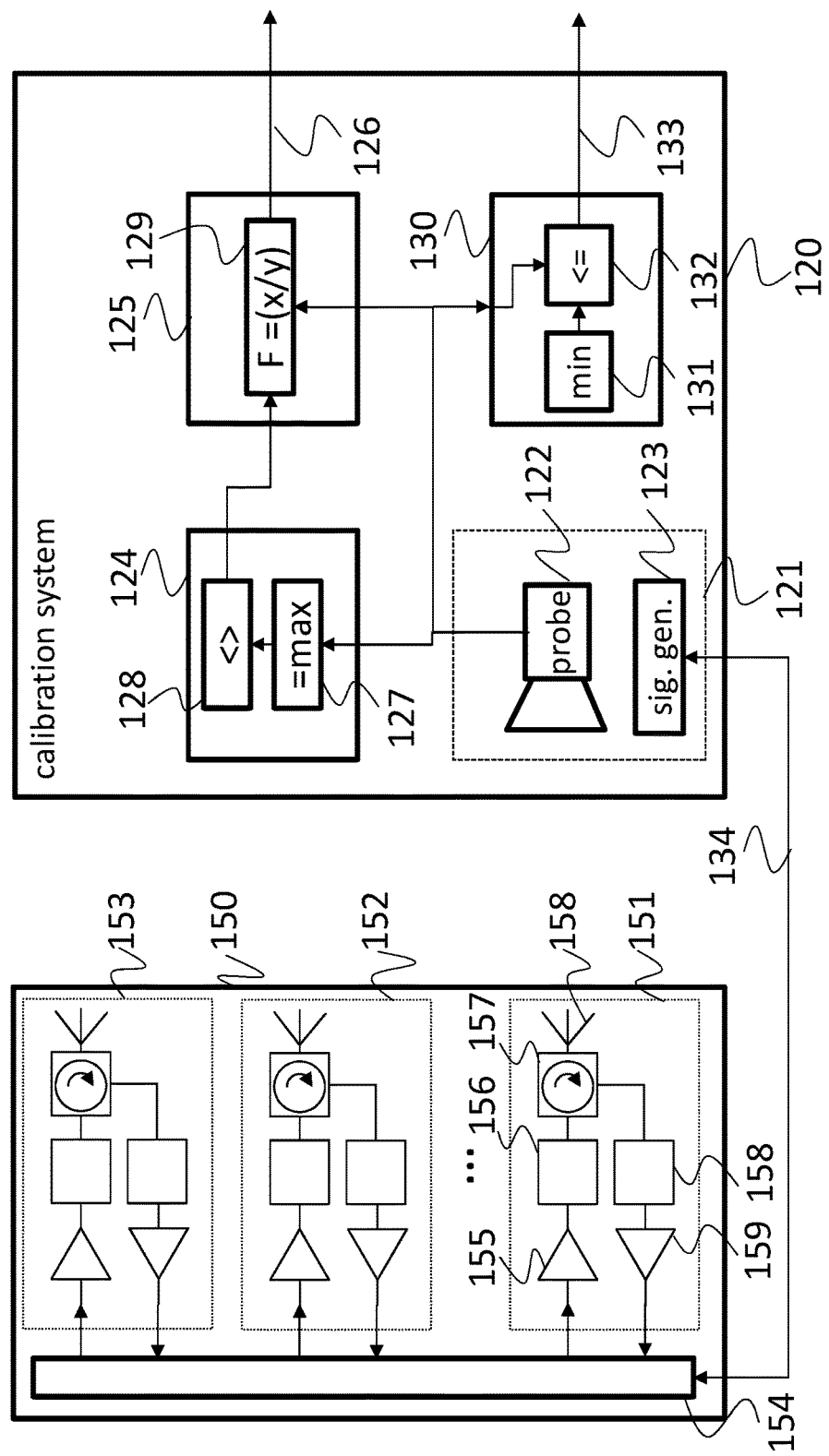
FIG. 8 shows a block diagram of another embodiment of a calibration system according to the present invention.

FIG. 8 shows a block diagram of another embodiment of a calibration system 120, which is based on the calibration system 100 of FIG. 6. Similar elements are provided with similar reference signs as in FIG. 6 but increased by 20.

In the calibration system 120, the determination module 124 comprises a function 127 to search all local maxima as shown in FIG. 7 and a function 128 to compare the local maxima to find the maximum with the lowest value. This value is the provided to the correction factor calculator 125, which comprises another function 129 to calculate based on the magnitude of the minimal maximum the correction factors 126 for all signal paths 151, 152, 153.

The calibration system 120 further comprises a verification unit 130 with a memory 131 and a function 132 that serves for verifying if all the signal paths 151, 152, 153 provide signals with at least the minimum power min. The value of min can e.g. be set by a user of the calibration system 120. If any one of the signal paths 151, 152, 153 provides a signal lower than the minimum power min, the verification unit 130 will output a warning signal 133.

It is understood that the calibration systems 100, 120 can be implemented in hardware, software or any combination therefore. Parts of the calibration systems 100, 120 can e.g. also be implemented in a configurable logic element, like e.g. a CPLD or FPGA.

Figure 9:
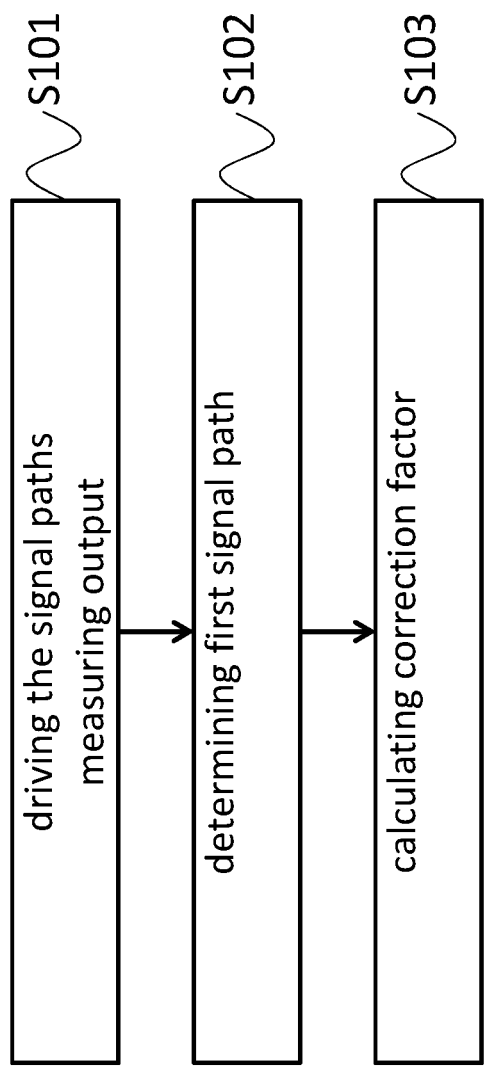
FIG. 9 shows flow diagram of another embodiment of a method according to the present invention.

FIG. 9 shows flow diagram of an embodiment of a method for calibrating a radio frequency, RF, device 150 comprising a plurality of signal paths 151, 152, 153. Each signal path 151, 152, 153 comprises at least an amplifier 155 and an antenna element 158.

The method comprises driving S101 the signal paths 151, 152, 153 with a predetermined test signal 107, 134 and measuring an output of the signal paths 151, 152, 153 in response to the test signal 107, 134. When measuring a physical parameter can be measured, which is influenced by emissions of the antenna elements 158 in response to the test signal 107, 134, in front of the antenna elements 158 as the output. The test signal 107, 134 can drive the signal paths 151, 152, 153 to a predetermined nominal, especially the maximum, gain level.

The test signal 107, 134 can comprise a radio frequency, RF, signal of a predetermined frequency. As an alternative, the test signal 107, 134 can comprise a digital command signal for the transceiver 154 of the RF device 150, which commands the transceiver 154 to drive the single signal paths 151, 152, 153 with a radio frequency, RF, signal of a predetermined frequency and/or to set the amplifiers 155 of the single signal paths 151, 152, 153 to a predetermined nominal gain factor.

Based on the measured output, a first signal path 151, 152, 153, of which the antenna element 158 provides the lowest output of all antenna elements 158, is identified 102. This can be done e.g. by identifying the values of the measurement data, which represent measurements in front of the positions of the antenna elements 158 and comparing the values of the measurement data, to determine the first signal path 151, 152, 153 with the lowest output.

Further, based on output of the first signal path 151, 152, 153 a correction factor 126 for the further signal paths 151, 152, 153 is calculated 103, such that with the applied correction factor 126 the output of all signal paths 151, 152, 153 is equal within a predetermined acceptance interval.

Calculating 103 can comprise dividing the lowest output value, which represents the first signal path 151, 152, 153, by the output value, which represents a respective other one of the signal paths 151, 152, 153.

The correction factors 126 can be provided as gain factors for the amplifiers of the respective signal paths 151, 152, 153. The correction factors 126 can e.g. be provided as digital values to a transceiver 154 or any signal-processing unit of the RF device 150, which drives the signal paths 151, 152, 153.

The method can also comprise verifying that all signal paths 151, 152, 153 provide an output, which is larger than a predetermined minimum output.

Figure 10:
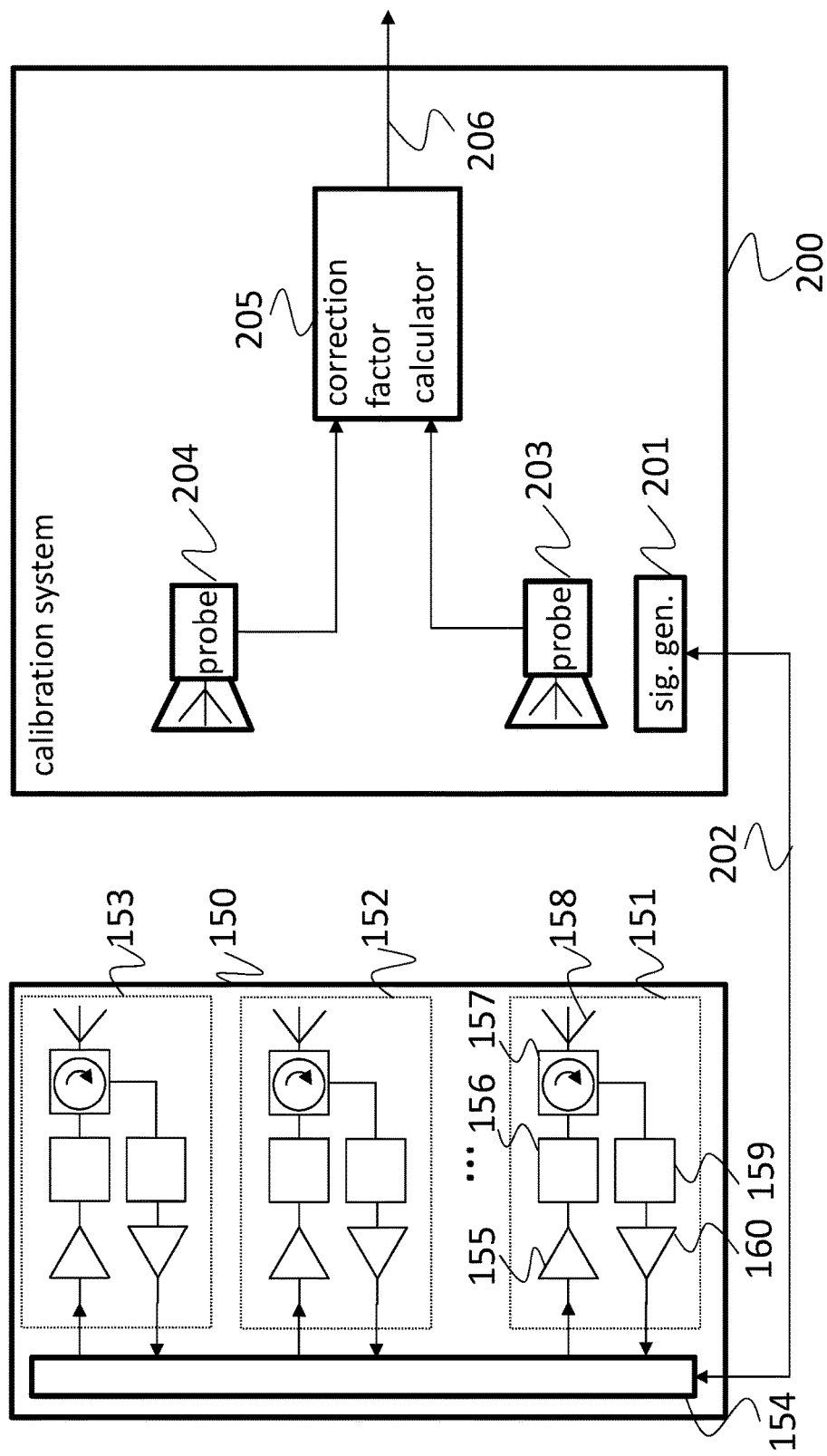
FIG. 10 shows a block diagram of another embodiment of a calibration system according to the present invention.

FIG. 10 shows a block diagram of a calibration system 200 for calibrating a radio frequency, RF, device 150 as already explained regarding FIG. 6. The RF device 150 comprises a plurality of signal paths 151, 152, 153. Each signal path 151, 152, 153 comprises at least an amplifier 155, 160 and an antenna element 158.

The calibration system 200 comprises a signal generator 201 for driving the signal paths 151, 152, 153 with a predetermined test signal 202. The test signal 202 can e.g. comprise a radio frequency, RF, signal, which can be provided to internal connectors of the RF device 150 for driving the signal paths 151, 152, 153 with the RF signal. This serves for testing the transmit signal chains.

The RF signal can also be provided to probes 203, 204 of the calibration system 200, e.g. antennas, for transmitting the test signal 202 to the respective antenna elements 158 of the respective signal paths 151, 152, 153 for testing the receive signal chains.

If the transmit and the receive signal chains are to be tested at the same time, the signal generator 201 can provide a first sub-signal of the RF signal to the probes 203, 204 for transmitting the test signal 202 to the respective antenna elements of the respective signal paths 151, 152, 153. The signal generator 201 can further provide a second sub-signal of the RF signal to the RF device 154 for driving the signal paths 151, 152, 153 with the RF signal.

As an alternative, the signal generator 201 can generate the test signal 202, or at least the second sub-signal comprising a digital command signal for a transceiver 154 of the RF device 150, which commands the transceiver 154 to drive the single signal paths 151, 152, 153 with a radio frequency, RF, signal of a predetermined frequency.

The calibration system 200 further comprises at least two probes 203, 204 for measuring the output of the signal paths 151, 152, 153 in reaction to the test signal 202. If the probes 203, 204 are used for transmitting a RF signal to the RF device 150, the output of the signal paths can be provided by the transceiver 154 to the calibration system 200.

The calibration system 200 can also comprise a correction factor calculator 205 for calculating respective correction factors 206 based on differences in at least one characteristic of the measured outputs of the signal paths 151, 152, 153. The characteristics of the measured outputs can comprise a phase and/or an amplitude and/or a frequency and/or a timing of the outputs. That means that the correction factor 206 can be calculated based on a difference in phase of the measured outputs, based on a difference in amplitude of the measured outputs, and/or based on a difference in frequency and/or timing of the measured outputs.

The correction factor calculator 205 can provide the correction factors 206 directly to elements of the respective signal paths 151, 152, 153. As an alternative, the correction factor calculator 205 can provide the correction factors 206 as digital values to a signal-processing unit, e.g. the transceiver 154, of the RF device 150, which drives the signal paths 151, 152, 153.

Figure 11:
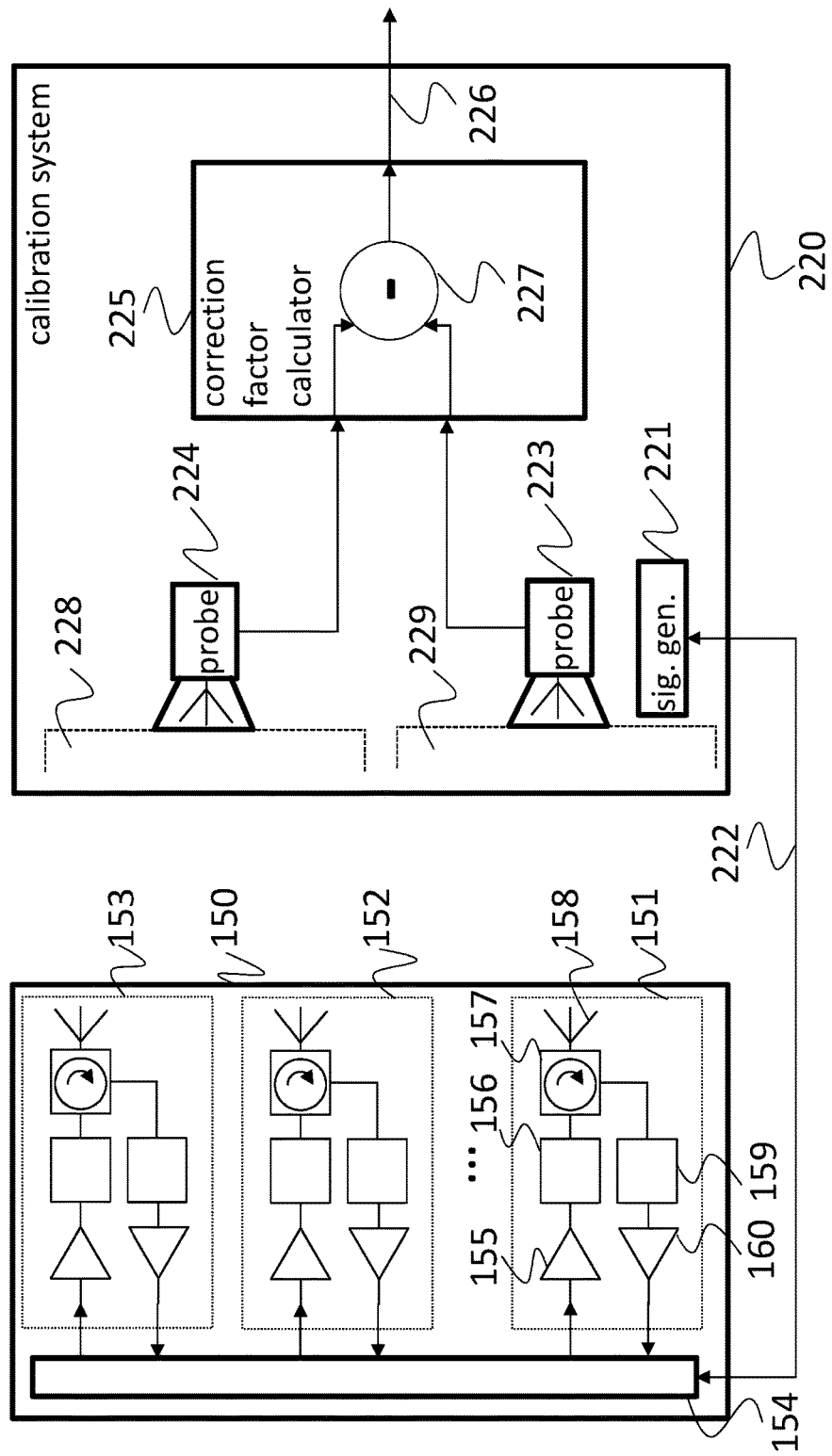
FIG. 11 shows a block diagram of another embodiment of a calibration system according to the present invention.

FIG. 11 shows a block diagram of another embodiment of a calibration system 220, which is based on the calibration system 200 of FIG. 10. Similar elements are provided with similar reference signs as in FIG. 10 but increased by 20.

In FIG. 11 the probes 223, 224 are spaced apart from each other by a predetermined distance which defines an exclusion zone 228, 229. The predetermined distance can e.g. only define a distance between the apertures of two probes 223, 224 or antennas 223, 224. The predetermined distance can especially be at least 0.4 times the wavelength of the test signal 222.

Figure 12:
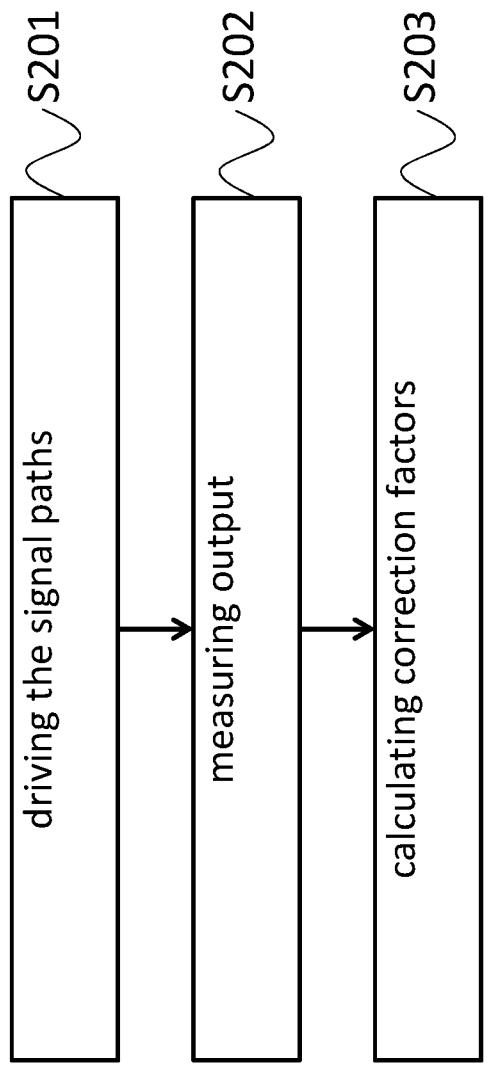
FIG. 12 shows flow diagram of another embodiment of a method according to the present invention.

FIG. 12 shows flow diagram of a calibration method for calibrating a radio frequency, RF, device 150 comprising a plurality of signal paths 151, 152, 153, each signal path 151, 152, 153 comprising at least an amplifier 155 and an antenna element 158.

The method comprises driving S201 the signal paths 151, 152, 153 with a predetermined test signal 202. The test signal 202 can e.g. comprise a radio frequency, RF, signal. The RF signal can e.g. be provided to internal connectors of the RF device 150 for driving the signal paths 151, 152, 153 with the RF signal. The RF signal can also be provided to the probes 203, 204 for transmitting the test signal 202 to the respective antenna elements 158 of the respective signal paths 151, 152, 153.

Further, a first sub-signal of the RF signal can be provided to the probes 203, 204 for transmitting the test signal 202 to the respective antenna elements 158 of the respective signal paths 151, 152, 153. A second sub-signal of the RF signal can be provided to the RF device 150 for driving the signal paths 151, 152, 153 with the RF signal.

The test signal 202 can also be generated as a digital command signal for a digital signal-processing unit, e.g. a transceiver 154, of the RF device 150, which commands the transceiver 154 to drive the single signal paths 151, 152, 153 with a radio frequency, RF, signal of a predetermined frequency.

Then the output of the signal paths 151, 152, 153 is measured S202 in reaction to the test signal 202 with at least two probes 203, 204.

The probes 203, 204 can be spaced apart from each other by a predetermined distance, which defines an exclusion zone. The predetermined distance can be based on a distance between the apertures of the two probes 203, 204 and comprise at least 0.4 times the wavelength of the test signal 202.

Respective correction factors 206, 226 are then calculated S203 based on differences in at least one characteristic of the measured outputs of the signal paths 151, 152, 153.

The characteristics of the measured outputs can comprise a phase, an amplitude, a frequency and/or a timing of the outputs. The respective correction factors 206, 226 can therefore be calculated based on a difference in phase of the measured outputs, based on a difference in amplitude of the measured outputs, and/or based on a difference in frequency and/or timing of the measured outputs.

The calculated correction factors 206, 226 can then be provided directly to elements of the respective signal paths 151, 152, 153. This means that the correction factors 206, 226 directly influence the elements of the respective signal paths 151, 152, 153. For example, parameters of a phase shifter 156 and/or an amplifier 155 can be set accordingly.

The calculated correction factors 206, 226 can e.g. be provided as digital values to a signal-processing unit, e.g. transceiver 154 of the RF device 150, which drives the signal paths 151, 152, 153. The transceiver can then pre-process the respective driving signals according to the correction factors 206, 226 or set the parameters in the respective elements.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

The invention claimed is:

1. A calibration system for calibrating an antenna array comprising a plurality of antenna elements, the system comprising:
   a signal generator for generating a predetermined test signal and, the signal generator being configured to provide the test signal to the antenna elements, wherein the signal generator is configured to drive single antenna elements of the plurality of antenna elements in a pattern to mitigate mutual influence between neighboring antenna elements,
   a number of probes for measuring at least one physical parameter, which is influenced by emissions or receptions of the test signal by the antenna elements, and providing respective measurement signals, and
   a position determination unit for determining based on the measurement signals the positions of the antenna elements as calibrated positions.

2. The calibration system of claim 1, further comprising:
a motion actuator for moving relatively to each other the probes and the antenna array, and
a recorder for recording the measurement signals together with the respective positions of the probes.

3. The calibration system of claim 2, wherein the position determination unit identifies the positions of the antenna elements based on maxima of the measurement signals and the positions of the respective maxima, or based on positions of the shifts, at which 1D or 2D auto-correlations of a magnitude pattern of the measured signals provide maxima, or based on a two dimensional Fourier series or Fourier Transform together with a measurement heatmap of the measured signals.

4. The calibration system of claim 2, wherein the motion actuator moves relatively to each other the probes and the antenna array such that the probes move in a first plane that is parallel to a second plane, in which the antenna elements lie.

5. The calibration system of claim 4, wherein the motion actuator moves relatively to each other the probes and the antenna array such that the probes move in a plurality of third planes that are parallel to the first plane and each distanced apart from the prior plane by a predetermined distance.

6. The calibration system of claim 1, wherein the motion actuator moves the probes to estimated start positions, which are estimated to lie in front of respective antenna elements and further moves the probes in a pre-defined zone until a maximum measurement value is identified.

7. The calibration system of claim 1, wherein the signal generator provides the test signal to all antenna elements at the same time.

8. The calibration system of claim 1, wherein the signal generator consecutively provides the test signal to the antenna elements one by one, or provides the test signal to pairs of the antenna elements or to at least three of the antenna elements at the same time.

9. The calibration system of claim 1, wherein the signal generator generates the test signal comprising a radio frequency, RF, signal of a predetermined frequency.

10. The calibration system of claim 1, wherein the signal generator generates the test signal comprising a digital command signal for a transceiver of the antenna array, which commands the transceiver to drive the single antenna elements with a radio frequency, RF, signal of a predetermined frequency.

11. The calibration system of claim 1, wherein the probes comprise a measurement element for measuring the value of the physical parameter or electromagnetic signals or wherein the probes comprise a transmitting element for transmitting the predetermined test signal or electromagnetic signals.

12. The calibration system of claim 11, wherein the measurement element comprises an antenna.

13. The calibration system of claim 12, wherein the antenna is adapted to the frequency of the test signal.

14. The calibration system of claim 1, wherein the measurement signal comprises a voltage or a current or a power.

15. The calibration system of claim 1, wherein the physical parameter comprises an electric field or a magnetic field or an electromagnetic field.

16. A calibration method for calibrating an antenna array comprising a plurality of antenna elements, the method comprising:
generating a predetermined test signal and providing the test signal to the antenna elements, comprising driving single antenna elements of the plurality of antenna elements in a pattern to mitigate mutual influence between neighboring antenna elements,
measuring at least one physical parameter with a number of probes, which is influenced by emissions or receptions of the test signal by the antenna elements, and providing respective measurement signals, and
determining based on the measurement signals the positions of the antenna elements as calibrated positions.

17. The calibration method of claim 16, further comprising:
moving relatively to each other the probes and the antenna array, and
recording the measurement signals together with the respective positions of the probes.

18. The calibration method of claim 17, wherein determining the positions comprises identifying the positions of the antenna elements based on maxima of the measurement signals and the positions of the respective maxima, or based on positions of the shifts, at which 1D or 2D auto-correlations of a magnitude pattern of the measured signals provide maxima, or based on a two dimensional Fourier series or Fourier Transform together with a measurement heatmap of the measured signals.

19. The calibration method of claim 17, wherein moving comprises moving relatively to each other the probes and the antenna array such that the probes move in a first plane that is parallel to a second plane, in which the antenna elements lie.

20. The calibration method of claim 19, wherein moving comprises moving relatively to each other the probes and the antenna array such that the probes move in a plurality of third planes that are parallel to the first plane and each distanced apart from the prior plane by a predetermined distance.

21. The calibration method of claim 16, wherein moving comprises moving the probes to estimated start positions, which are estimated to lie in front of respective antenna elements and further moving the probes in a pre-defined zone until a maximum measurement value is identified.

22. The calibration method of claim 16, wherein providing the test signal comprises providing the test signal to all antenna elements at the same time.

23. The calibration method of claim 16, wherein providing the test signal comprises consecutively providing the test signal to the antenna elements one by one, or provides the test signal to pairs of the antenna elements or to at least three of the antenna elements at the same time.

24. The calibration method of claim 16, wherein providing the test signal comprises generating the test signal comprising a radio frequency, RF, signal of a predetermined frequency.

25. The calibration method of claim 16, wherein providing the test signal comprises generating the test signal comprising a digital command signal for a transceiver of the antenna array, which commands the transceiver to drive the single antenna elements with a radio frequency, RF, signal of a predetermined frequency.

26. The calibration method of claim 16, wherein the probes are provided with a measurement element for measuring the value of the physical parameter or electromagnetic signals or wherein the probes are provided with a transmitting element for transmitting the predetermined test signal or electromagnetic signals.

27. The calibration method of claim 26, wherein the measurement element comprises an antenna.

28. The calibration method of claim 27, wherein the antenna is adapted to the frequency of the test signal.

29. The calibration method of claim 16, wherein the measurement signal comprises a voltage or a current or a power or a phase of the measured physical parameter.

30. The calibration method of claim 16, wherein the physical parameter comprises an electric field or a magnetic field or an electromagnetic field.

* * * * *